US006759900B1

(12) United States Patent
Chen

(10) Patent No.: US 6,759,900 B1
(45) Date of Patent: Jul. 6, 2004

(54) HIGH BANDWIDTH AND WIDE DYNAMIC RANGE PREAMPLIFIER WITH HIGH STABILITY

(75) Inventor: Xue Ying Chen, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/342,706

(22) Filed: Jan. 15, 2003

(51) Int. Cl.[7] .............................. H03F 1/36; H03F 3/08
(52) U.S. Cl. .................. 330/86; 330/308; 252/214 AG; 252/214 A; 398/140; 398/210
(58) Field of Search .................. 330/86, 308; 398/140, 398/210; 250/214 AG, 214 A

(56) References Cited

U.S. PATENT DOCUMENTS 6,140,878 A * 10/2000 Masuta ....................... 330/308

FOREIGN PATENT DOCUMENTS

JP          362145906     *  6/1987

OTHER PUBLICATIONS

Taylor et al. "A ZpA/5 Hz 6ZZ Mb/s GaAs MESFET Transimpedance Amplifier" 1994 IEEE International.*
Solid–State Circuits Conference Digest of Technical Papers 41st ISSCC Feb. 16–18, 1994 pp 254–255.*

* cited by examiner

Primary Examiner—Michael B Shingleton

(57) ABSTRACT

A preamplifier includes a detector to detect an input optical power level and convert the detected input optical power level into an input current. The preamplifier also includes a transimpedance amplifier that provides a gain for the input current received from the detector. A dummy transimpedance amplifier is provided to supply a reference voltage. The dummy transimpedance amplifier has a structure similar to that of the transimpedance amplifier. A unity gain buffer is used to reduce the output impedance of the reference voltage and to output a bias voltage to both the transimpedance amplifier and the dummy transimpedance amplifier. This bias voltage can make the gate-controlled MOSFET working in its triode region, and the load resistance of the core amplifier can be easily controlled such that the gain and bandwidth of the core amplifier can be widely controlled. This results in the preamplifier having a high stability while its feedback resistor is controlled to achieve wide dynamic range.

14 Claims, 5 Drawing Sheets

HIGH BANDWIDTH AND WIDE DYNAMIC RANGE PREAMPLIFIER WITH HIGH STABILITY

FIELD OF THE INVENTION

The present invention pertains to fiber-optical communication systems. More particularly, the present invention relates to a preamplifier used in fiber-optical communication systems that converts optical signals into electronic data, wherein the preamplifier has a high bandwidth, wide dynamic range, and with high stability.

BACKGROUND

In fiber-optic communication systems, a preamplifier is typically used to convert optical signals received from an optical cable into electronic data. Such a preamplifier generally requires a relative high bandwidth and wide dynamic range. The wide dynamic range generally requires a relatively low noise and high overload.

A prior preamplifier circuit typically uses a resistor to convert a current signal, which is converted from the optical power by the detector, to a voltage signal. The high bandwidth requirement for a preamplifier in fiber-optic communication systems means that the preamplifier circuit needs to have a relatively small resistor. However, a small resistor typically increases the noise of the preamplifier circuit, which can not sense required small input optical power.

On the other hand, a relatively high bandwidth and wide dynamic range preamplifier can be achieved by using a transimpedance feedback amplifier in conjunction with an automatic gain control (AGC) function.

Compare with sole resistor, transimpedance feedback amplifier can be implemented by using a large feedback resistor, which helps to achieve low noise while still achieving high bandwidth. This is due to the fact that a high gain core amplifier can reduce the input impedance of the amplifier. Large feedback resistor can not handle large input optical power, which means AGC is required. AGC means automatically controlling the gain of the transimpedance amplifier according to the input optical power. AGC can help achieve high overload, while still maintaining low noise because at the small input optical power levels, AGC does not function. The gain of the preamplifier can still be high enough to have the low noise feature.

One prior technique for controlling the gain of the transimpedance amplifier is to control the feedback resistance of the transimpedance amplifier. Feedback resistance is reduced as input optical power increases. Changing the feedback resistance, however, affects the impedance and pole frequency at the input node of the transimpedance amplifier. In addition, stability problems arise when the feedback resistance decreases at higher input optical levels. When the resistance of the feedback resistor is decreased to reduce the gain of the preamplifier, the core amplifier should be controlled to maintain the stability of the preamplifier. This is achieved by controlling the bandwidth and the gain of the core amplifier. The bandwidth can be increased, and the gain of the core amplifier is decreased.

FIGS. 1 and 2 show a prior preamplifier 100 that depicts the stability problems and a prior solution in trying to solve the stability problems. As can be seen from FIG. 1, a core amplifier 120 and a feedback resistor 130 form a transimpedance amplifier. A detector 110 is used to convert the input optical signal 105 into electrical signal (i.e., $I_{in}$). The resistance of the feedback resistor 130 can vary according to the power of the input optical signal 105.

FIG. 2 shows only the simplified amplifying stage of the core amplifier 120 of FIG. 1, using BiCMOS process. The circuit in FIG. 2 also shows the bandwidth and gain control of the core amplifier 120, which includes a gate-controlled MOSFET 330 connected in parallel with a load resistor 340. The drain of the MOSFET 330 is connected to a power supply rail 310. This means that the MOSFET 330 cannot work in its triode region. Thus, this MOSFET 330 operates as a gate-controlled current source, instead of gate-control resistor. This MOSFET 330 actually controls the transimpedance ($G_m$) of the core amplifier 120, not the load impedance.

One disadvantage for this structure is that the bandwidth of the core amplifier 120 is difficult to extend. This is due to the fact that the relatively large load resistance (i.e., the load resistor 340) of the core amplifier 120 is required to achieve high gain, thus to meet the bandwidth requirement before AGC active. As described above, the MOSFET 330 actually controls the transimpedance ($G_m$) of the core amplifier 120, not the load impedance. The load resistance cannot be changed by the configuration shown in FIG. 2. Another disadvantage is, the bias current of the core amplifier 120 may need to vary within a very wide range in order to obtain a widely controlled core amplifier to achieve a wide dynamic range preamplifier 100. This makes the current consumption unacceptable at sensitivity levels. This will be described in more detail below.

For a collector-emitter structure, the gain is calculated as ($G_m \times R_c$). For the configuration shown in FIG. 2, the transimpedance $G_m$ is controlled, while the load resistor (i.e. $R_c$ 340) is constant. The transimpedance $G_m$ is directly related to the bias current of the amplifying transistor 350. If the gain of the core amplifier 120 is to be controlled widely, the transimpedance $G_m$ should be controlled widely. That is, the bias current should be controlled widely. A suitable dynamic range may, for example, involve core amplifier gain control up to an order of magnitude, that is, a multiplicative range of 10. There is, however, a lower bias current limit provided by the load resistor 340 itself. This lower limit may, for example, be 0.3 mA. These exemplary figures imply a need to provide 3 mA bias current to increase the core amplifier's gain. In practice, the bias current needs to vary even further, while further current variation may be too great to accept.

In view of the above, a need clearly exists for designing a high bandwidth and wide dynamic range preamplifier with high stability.

SUMMARY OF THE INVENTION

The feature of the present invention is to provide a high bandwidth and wide dynamic range preamplifier with high stability.

The detailed feature of the present invention is to control the core amplifier by a dummy transimpedance amplifier and a unit gain buffer while controlling the feedback resistance of the preamplifier such that the preamplifier operates stably over wide dynamic range.

A preamplifier includes a detector to detect an input optical power level and convert the detected input optical power level into an input current. The preamplifier also includes a transimpedance amplifier that converts the input current to voltage signal. A dummy transimpedance amplifier is provided to supply a reference voltage. The dummy transimpedance amplifier has a structure similar to that of the transimpedance amplifier, but it does not receive any input signal. A unity gain buffer is provided to reduce the output impedance of the reference voltage to provide a bias voltage, and to output the bias voltage to both the transimpedance amplifier and the dummy transimpedance amplifier such that the preamplifier operates with high stability, high bandwidth, and wide dynamic range.

DETAILED DESCRIPTION

Figure 1:
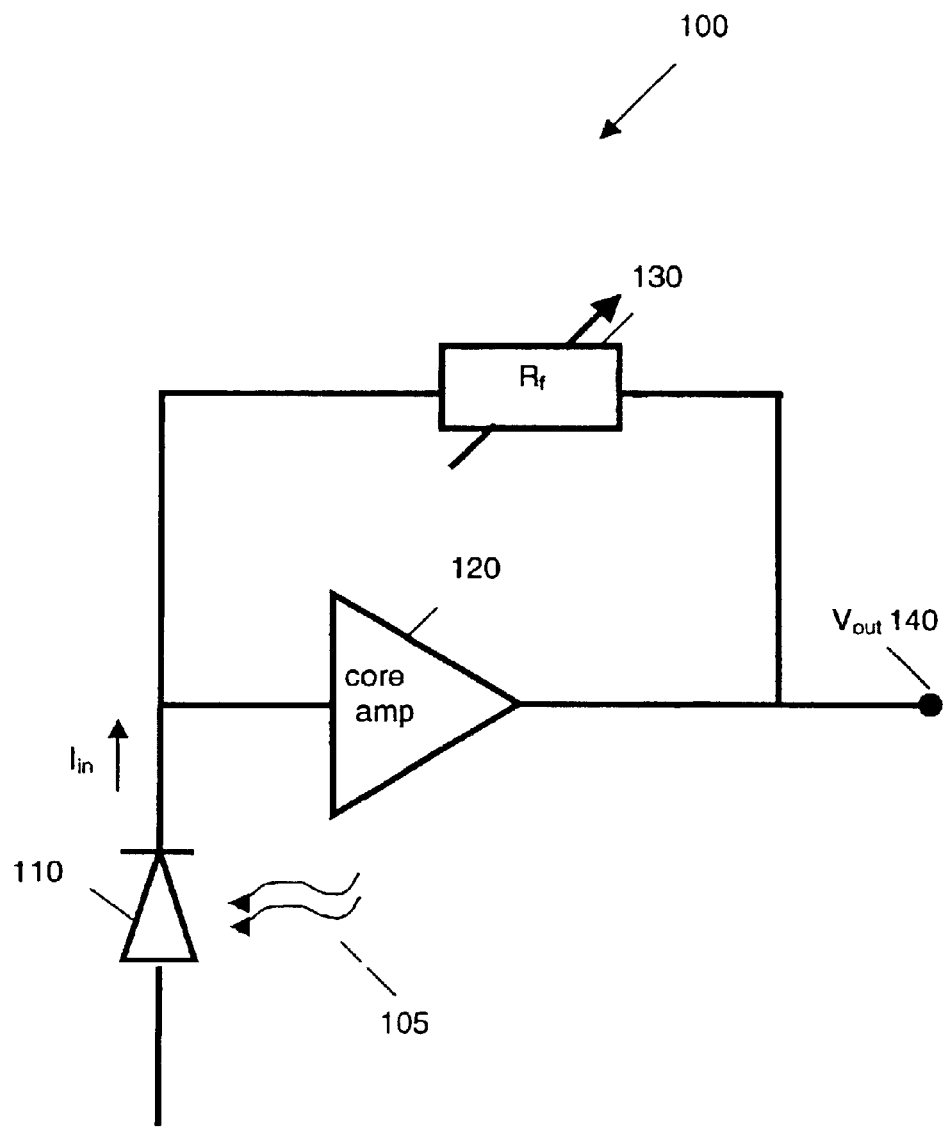
FIG. 1 shows a prior art preamplifier for opto-electronic conversions, wherein the preamplifier includes a detector, a core amplifier, and a feedback resistor.
Figure 2:
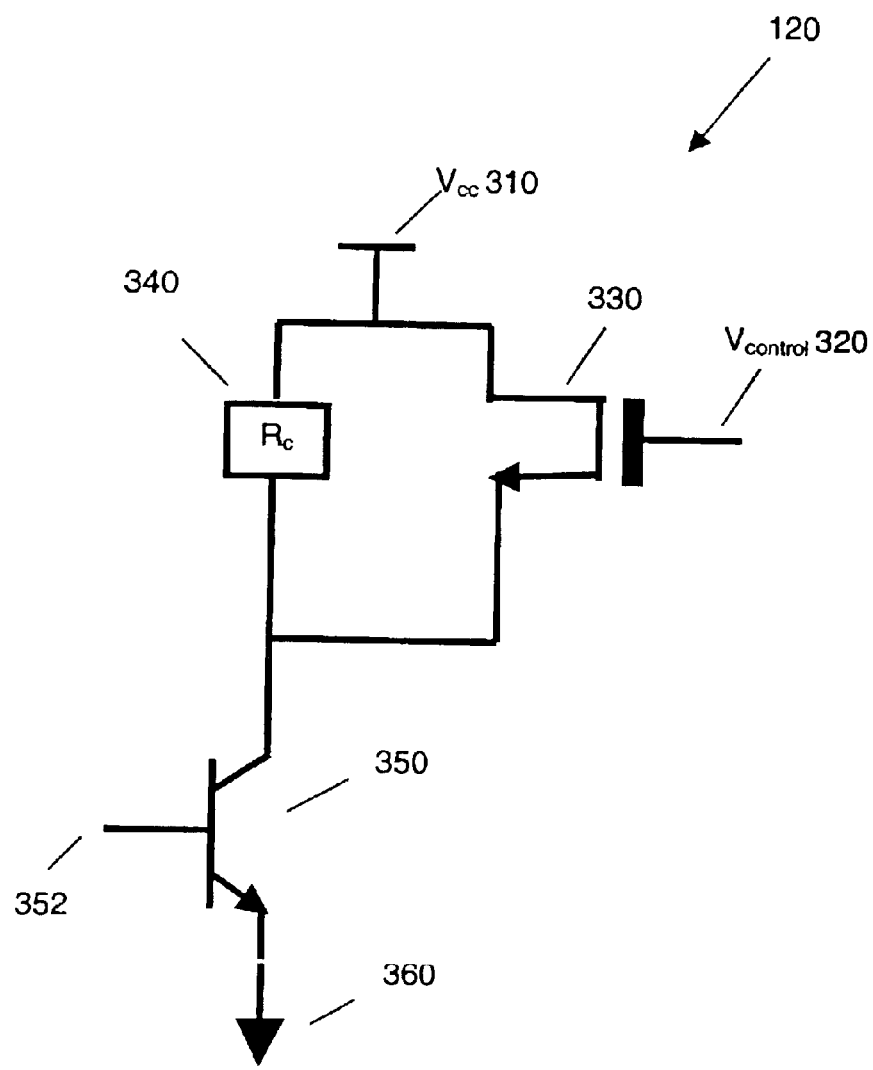
FIG. 2 shows the simplified BiCMOS circuit of the amplifying stage of the core amplifier of FIG. 1.
Figure 3:
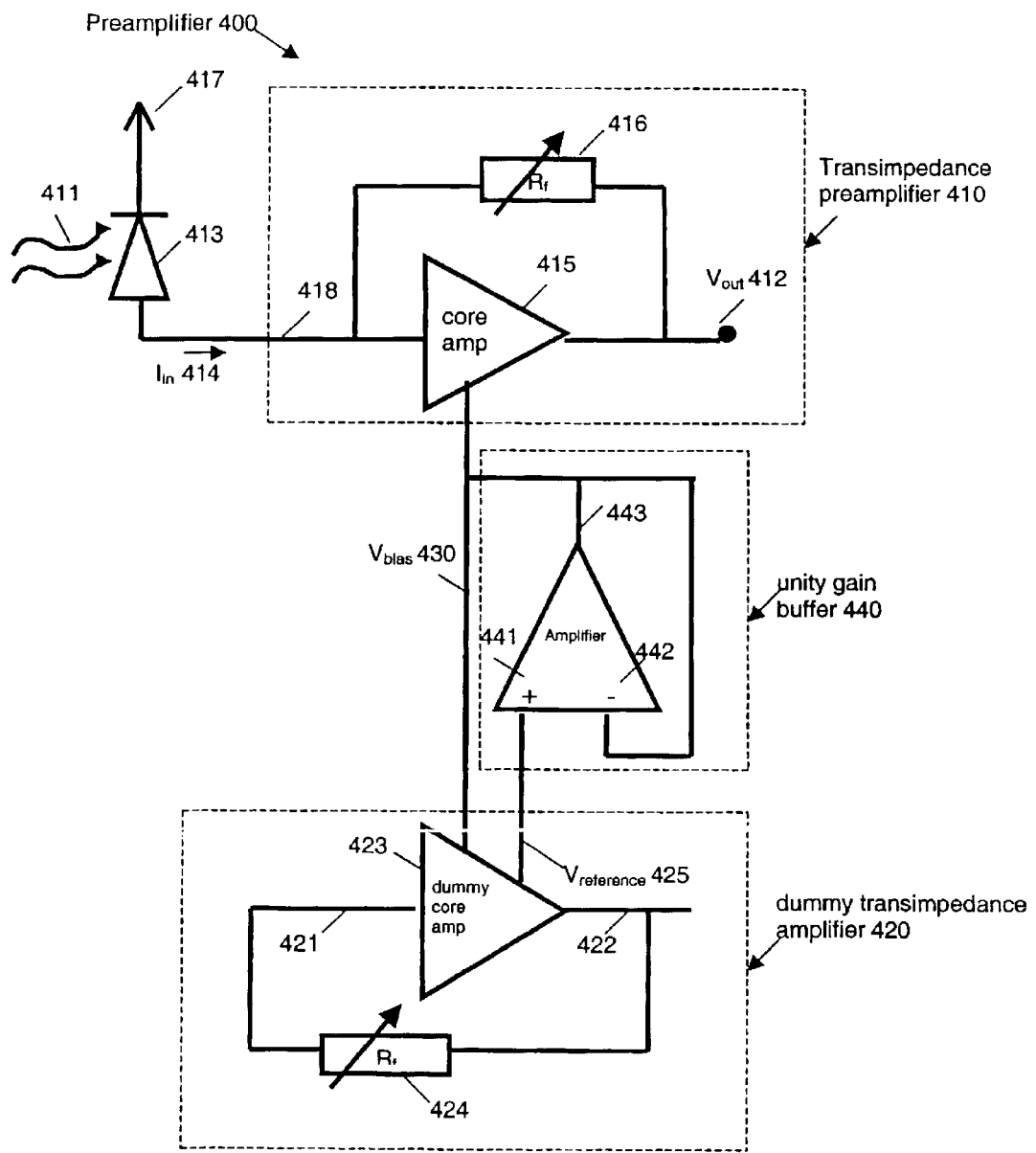
FIG. 3 shows a preamplifier circuit in accordance with one embodiment of the present invention, wherein the preamplifier includes an optical signal detector, a transimpedance amplifier, a dummy transimpedance amplifier, and a unity gain buffer.

FIG. 3 shows a preamplifier circuit 400 that implements one embodiment of the present invention. The preamplifier circuit 400 includes an optical signal detector (e.g., a photodiode) 413, a transimpedance amplifier 410, a dummy transimpedance amplifier 420, and a unity gain buffer 440. In accordance with one embodiment of the present invention, the preamplifier circuit 400 operates stably over a wide dynamic range. This is due to the configuration of the transimpedance amplifier 410 as well as the use of the dummy transimpedance amplifier 420 and the unity gain buffer 440, which will be described in more detail below, also in conjunction with FIGS. 3–5.

Briefly, the dummy transimpedance amplifier 420 is mainly used to is supply a reference voltage (i.e., $V_{reference}$ 425). The reference voltage $V_{reference}$ 425 is produced from the source of a corresponding transistor (i.e., the MOSFET 630 in FIG. 5) inside the dummy core amplifier 423 of the dummy transimpedance amplifier 420. MOSFET means Metal Oxide Silicon Field Effect Transistor. The dummy transimpedance amplifier 420 has a structure similar to that of the transimpedance amplifier 410. But the dummy transimpedance amplifier 420 does not receive any input signal. This reference voltage $V_{reference}$ 425 at point A'645 (shown in FIG. 5) is tracing the voltage at the point A 545 (shown in FIG. 4) when there is no optical power. If the AGC functions well, the output voltage swing of the transimpedance amplifier 410 is not too high, which means this reference voltage $V_{reference}$ 425 does not deviate much from the voltage at the point A 545 over wide input dynamic range. That results in the MOSFET 530 (shown in FIG. 4) actually working in its triode region, and acting as a gate-controlled-resistor when analyzing the respective circuit in which the MOSFETS 530 operates. But this reference voltage $V_{reference}$ 425 is from a high impedance point of A'645, it can not be take as a nearly ideal voltage source. If it is fed directly to the drain of the MOSFET 530, the AC performance of the core amplifier 415 will be greatly affected. The unity gain buffer 440 is provided to reduce the output impedance of the reference voltage $V_{reference}$ 425.

The reference voltage $V_{reference}$ 425 is fed to the positive input of the unity gain buffer 440 to produce the bias voltage $V_{bias}$ 430. The $V_{bias}$ 430 is almost the same as the reference voltage $V_{reference}$ 425. The bias voltage $V_{bias}$ 430, instead of the reference voltage $V_{reference}$ 425, is applied to the drain of a transistor (i.e., the MOSFET 530 in FIG. 4) within the core amplifier 415 of the transimpedance amplifier 410. The bias voltage $V_{bias}$ 430 also supplies to the drain of a transistor (i.e., the MOSFET 630 in FIG. 5) within a dummy core amplifier 423 of the dummy transimpedance amplifier 420. This can make the dummy transimpedance amplifier 420 really identical to the transimpedance amplifier 420, thus making the reference voltage $V_{reference}$ 425 really tracing the voltage at the point A 545 when there is no optical power. Using this bias voltage $V_{bias}$ 430 to bias the drain of MOSFETS 530 can easily control the output impedance of MOSFETS 530 without affecting its ac performance. This causes the gain and bandwidth of the core amplifier 415 to be well controlled while control the output impedance of MOSFETS 530.

In addition, because the unity gain buffer 440 is used between the reference voltage (i.e., $V_{reference}$ 425) and the bias voltage (i.e., $V_{bias}$ 430) to isolate these two signals, the output impedance of the reference voltage $V_{reference}$ 430 is reduced such that the bias voltage is a nearly ideal virtual ground voltage, or a DC voltage. The described configuration allows the preamplifier 400 to have a stable operation while the gain of the transimpedance amplifier 410 is changing. The preamplifier 400 can be really implemented over a wide dynamic range with high stability. The preamplifier 400 in accordance with one embodiment of the present invention will be described in more detail below.

As can be seen from FIG. 3, the optical detector 413 receives an input optical signal 411 and converts it into a current signal $I_{in}$ 414, which is fed to the transimpedance amplifier 410. The transimpedance amplifier 410 provides an output voltage $V_{out}$ 412 based on the input current signal $I_{in}$ 414 and its feedback resistance.

The amplifier 410 includes the core amplifier 415, and a controlled feedback resistor $R_f$ 416. The cathode of the detector (e.g., photodiode) 413 is connected to a filtered voltage supply rail, and the anode of photodiode 413 is connected to a node 418. The output voltage $V_{out}$ 412 is connected to the node 418 via the core amplifier 415 and the controlled-feedback resistor $R_f$ 416.

The dummy transimpedance amplifier 420 includes a dummy core amplifier 423 and a controlled feedback resistor $R_f'$424. The dummy transimpedance amplifier 420 has an input 421 and an output 422. The output 422 is connected to the input 421 via the dummy core amplifier 423 and controlled-feedback resistor $R_f'$424.

The dummy core amplifier 423 has substantially the same internal structure as the core amplifier 415. The controlled feedback resistor $R_f'$424 has substantially the same structure and value as the controlled feedback resistor $R_f$ 416.

The reference voltage $V_{bias}$ 430 is applied to the drain of the MOSFETs (i.e., 530 and 630 in FIGS. 4–5) inside both the core amplifier 415 and the dummy core amplifier 423. The value of this bias voltage $V_{bias}$ 430 is substantially the same as the voltage at point A 545 (FIG. 4) in the core amplifier 415 when there is no input optical signal to the detector 413. As described above, the bias voltage $V_{bias}$ 430 is derived from the reference voltage $V_{reference}$ 425.

The reference voltage $V_{reference}$ 425 at the point A'645 (see FIG. 5) in the dummy core amplifier 423 is applied to the positive input 441 of the unity gain buffer 440. The output 443 of the unity gain buffer 440 is connected directly back to the negative input 442 of the unity gain buffer 440. The output 443 of the unity gain buffer 440 also outputs the bias voltage $V_{bias}$ 430. The unity gain buffer 440 is used to isolate the voltage $V_{bias}$ 430 from the voltage $V_{reference}$ 425 such that the bias voltage $V_{bias}$ 430 has a low output impedance and can be taken as a ideal voltage source.

Figure 4:
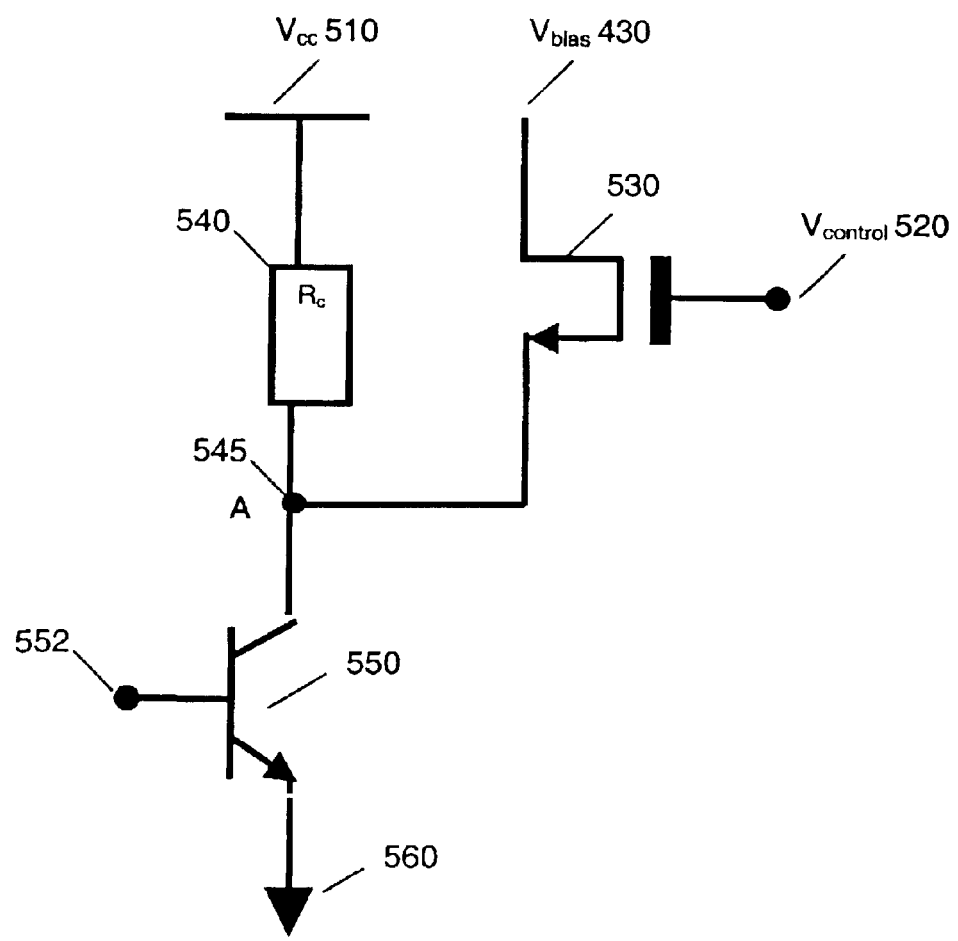
FIG. 4 shows the simplified BiCMOS circuit of the amplifying stage inside a core amplifier of the transimpedance amplifier of FIG. 3.

FIG. 4 shows the simplified BiCMOS amplifying stage inside the core amplifier 415 of FIG. 3. As can be seen from FIG. 4, the drain of the MOSFET 530 is connected not to a supply voltage rail 510 but to the bias voltage $V_{bias}$ 430. A control voltage $V_{control}$ 520 connects directly to the gate of the MOSFET 530, the source of which is connected directly to the collector of a transistor 550. The transistor 550 is a bipolar transistor, in one embodiment. A load resistor $R_c$ 540 is connected directly between supply voltage rail $V_{cc}$ 510 and the collector of the transistor 550. Input 552 is connected directly to the point 418 as shown in FIG. 3. Input 552 is provided to the base of the transistor 550, the emitter of which is connected straight to ground 560. In FIG. 4, the point A 545 is located at the source of the MOSFET 530 and collector of the transistor 550. The signal at point A 545 is applied to the Vout 412 (shown in FIG. 3) after some processing by, for example, an emitter-follower.

Figure 5:
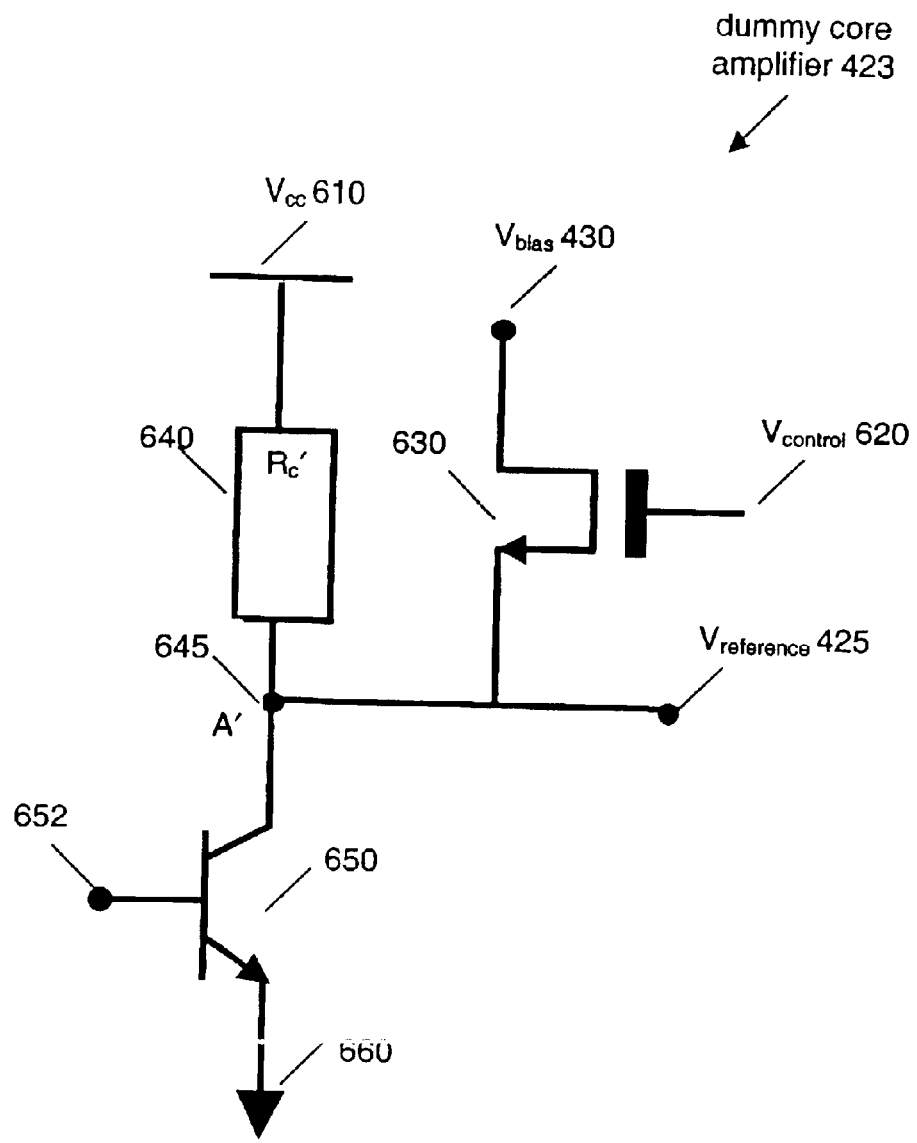
FIG. 5 shows the simplified BiCMOS circuit of the amplifying stage inside a core amplifier of the dummy transimpedance amplifier of FIG. 3.

FIG. 5 shows the simplified BiCMOS amplifying stage inside the dummy core amplifier 423 of FIG. 3. This configuration is the same as that represented in FIG. 4 for the core amplifier 415. Corresponding components are given corresponding reference numbers in FIG. 4 and FIG. 5. In FIG. 5, there is also identified a point A'645 at the source of the MOSFET 630 and collector of the transistor 650. This point A' provides reference voltage $V_{reference}$ 425 to the unity gain buffer 440 (FIG. 3). Input 652 is connected directly to the point 421 as shown in FIG. 3. The signal at point A'645 is applied, as the output of the dummy core amplifier 423 to the resistor 424 (shown in FIG. 3) after some processing by, for example, an emitter-follower.

Point A'645 represented in FIG. 5 (corresponding to point A 545 in the core amplifier 415 represented in FIG. 4) in the dummy core amplifier 423 is a high impedance point, because relatively high gain is required for the core amplifier to achieve high bandwidth before AGC active. If the bias voltage $V_{bias}$ 430 is obtained directly from this point of A'645, the AC performance of the transimpedance amplifier 410 is affected too much because the reference voltage $V_{reference}$ 425 cannot be taken as a virtual ground voltage any more. The unity gain buffer 440 is designed to have relatively low output impedance. This unity gain buffer 440 can isolate these two voltages, $V_{bias}$ 430 and $V_{reference}$ 425, and maintain these two voltages as almost equal, thus generating a near ideal virtual ground bias voltage for the MOSFET 530 in core amplifier 415. Consequently, the AC response of the transimpedance amplifier 410 is not affected by the dummy transimpedance amplifier 420.

As described above, $V_{reference}$ 425 and $V_{bias}$ 430 are almost equal. This means that $V_{bias}$ is almost the same as the voltage at point A 545 in the core amplifier 415 when there is no input optical signal. As an automatic gain control function operates well, the voltage at point A 545 in the core amplifier 415 does not change much with changing input optical signal. Consequently, each of MOSFET 530 and MOSFET 630 readily operates in their triode region, and can be considered to be gate-controlled-resistors when analyzing the respective circuits in which these MOSFETS 530, 630 operate.

The MOSFET impedance can be controlled by the gate control voltage and width length ratio. The equivalent output impedance of MOSFET 530, 630 can be reduced to a relatively small value. For a collector-emitter structure, the gain is calculated as $(G_m \times R_c)$. Widely controlled load resistance Rc will result in widely controlled gain and bandwidth of the core amplifier.

The core amplifier 415 is controlled by controlling its load impedance (e.g., the load resistor $R_c$ 540 and the MOSFET 530). Assume that the transimpedance $G_m$ is constant (this can be achieved by supplying a constant bias current to the amplifying transistor 550, this current will be the main contributor to the $G_m$ of the transistor instead of the current from the MOSFET 530), the load impedance can be widely controlled. This is done by controlling the output impedance of the MOSFET 530. A widely controlled load impedance results in widely controlled core amplifier gain and bandwidth. This will not affect the current consumption while the input optical power change.

The actual output current of the MOSFET 530, 630 can also vary. But there is not a substantial amount of current flowing through MOSFETs 530, 630 when compared to operation in the linear region. The effect of the MOSFET's output current can also be further reduced by either providing a constant bias current or adding a degeneration resistor to the amplifier transistor 550 and 650 inside the core amplifier 415 and 423. These alternative measures assist to appropriately control the gain and bandwidth of the core amplifier 415 and dummy core amplifier 423 by changing the load impedance. Accordingly, the stability of the transimpedance amplifier 410 is maintained when controlling its gain.

Various alterations and modifications can be made to the arrangements and techniques described herein, as would be apparent to one skilled in the relevant art.

What is claimed is:

1. A preamplifier, comprising:
   a detector to detect an input optical power level and convert the detected input optical power level into an input current;
   a transimpedance amplifier that provides a gain for the input current received from the detector;
   a dummy transimpedance amplifier having a structure similar to that of the transimpedance amplifier to supply a reference voltage; and
   a unity gain buffer to reduce the output impedance of the reference voltage to produce a bias voltage, and to output the bias voltage to both the transimpedance amplifier and the dummy transimpedance amplifier.

2. The preamplifier as claimed in claim 1, wherein the bias voltage has virtual ground voltage and a predetermined DC voltage.

3. The preamplifier as claimed in claim 2, wherein the bias voltage is applied to a drain of a transistor within an amplifying stage of a core amplifier of the transimpedance amplifier such that the transistor operates in its triode region to allow control of the gain and bandwidth of the core amplifier over a wide range by controlling the transistor's output impedance.

4. The preamplifier as claimed in claim 3, wherein the transistor is a field-effect transistor that has its gate receiving an automatic gain control signal, which is proportional to the input optical power.

5. The preamplifier as claimed in claim 4, wherein the unity gain buffer reduces the output impedance of the bias voltage by having low output impedance.

6. The preamplifier as claimed in claim 1, wherein the unity gain buffer has low output impedance and has (1) its positive input coupled to the reference voltage provided by the dummy transimpedance amplifier and (2) its output coupled to its negative input and the bias voltage such that the output impedance of the bias voltage is reduced.

7. The preamplifier as claimed in claim 6, wherein the unity gain buffer has its positive input receiving the reference voltage from a collector of a bipolar transistor of the dummy transimpedance amplifier, and its output connected to a drain of a gate-controlled-MOSFET transistor within both the transimpedance amplifier and the dummy transimpedance amplifier to provide the bias voltage with low output impedance.

8. A control circuit for a transimpedance amplifier, comprising:
a dummy transimpedance amplifier having a structure similar to that of the transimpedance amplifier to supply a reference voltage; and
a unity gain buffer to reduce the output impedance of the reference voltage to provide a bias voltage, and to output the bias voltage to both the transimpedance amplifier and the dummy transimpedance amplifier.

9. The control circuit of claim 8, wherein the bias voltage has a virtual ground voltage and a predetermined DC voltage.

10. The control circuit of claim 9, wherein the bias voltage is applied to a drain of a transistor within an amplifying stage of a core amplifier of the transimpedance amplifier such that the transistor operates in its triode region such that the gain and bandwidth of the core amplifier is controlled over a wide range by controlling the transistor's output impedance.

11. The control circuit as claimed in claim 10, wherein the transistor is a field-effect transistor that has its gate receiving an automatic gain control signal, which is proportional to the input optical power.

12. The control circuit as claimed in claim 11, wherein the unity gain buffer reduces the output impedance of the bias voltage by having low output impedance.

13. The control circuit as claimed in claim 8, wherein the unity gain buffer has low output impedance and has (1) its positive input coupled to the reference voltage provided by the dummy transimpedance amplifier and (2) its output coupled to its negative input and the bias voltage such that the output impedance of the bias voltage is reduced.

14. The control circuit as claimed in claim 8, wherein the unity gain buffer has its positive input receiving the reference voltage from a collector of a bipolar transistor of the dummy transimpedance amplifier, and its output connected to a drain of a gate-controlled-MOSFET transistor within both the transimpedance amplifier and the dummy transimpedance amplifier to provide the bias voltage with low output impedance.

* * * * *